United States Patent
Biber et al.

(10) Patent No.: US 9,035,654 B2
(45) Date of Patent: May 19, 2015

(54) MECHANICALLY FLEXIBLE MAGNETIC RESONANCE COIL WITH OPENING CONDUCTOR STRUCTURES

(75) Inventors: Stephan Biber, Erlangen (DE); Patrick Gross, Langensendelbach (DE)

(73) Assignee: Siemens Aktiengesellschaft, München (DE)

( * ) Notice: Subject to any disclaimer, the term of this patent is extended or adjusted under 35 U.S.C. 154(b) by 422 days.

(21) Appl. No.: 13/198,652

(22) Filed: Aug. 4, 2011

(65) Prior Publication Data

US 2012/0194192 A1 Aug. 2, 2012

(30) Foreign Application Priority Data

Aug. 4, 2010 (DE) .......................... 10 2010 033 322

(51) Int. Cl.
| | | |
|---|---|---|
| *G01V 3/00* | (2006.01) | |
| *G01R 33/341* | (2006.01) | |
| *G01R 33/36* | (2006.01) | |
| *G01R 33/34* | (2006.01) | |
| *G01R 33/3415* | (2006.01) | |

(52) U.S. Cl.
CPC ........ *G01R 33/341* (2013.01); *G01R 33/34007* (2013.01); *G01R 33/34084* (2013.01); *G01R 33/3415* (2013.01); *G01R 33/3664* (2013.01)

(58) Field of Classification Search
CPC ....................................... G01R 33/34–33/3678
USPC ................................................. 324/300–322
See application file for complete search history.

(56) References Cited

U.S. PATENT DOCUMENTS

| | | | |
|---|---|---|---|
| 4,897,604 A | | 1/1990 | Carlson et al. |
| 5,075,624 A | * | 12/1991 | Bezjak .......................... 324/318 |
| 5,274,332 A | * | 12/1993 | Jaskolski et al. .............. 324/318 |
| 5,327,898 A | * | 7/1994 | Yoshino et al. ................ 600/422 |
| 6,029,082 A | * | 2/2000 | Srinivasan et al. ............ 600/422 |
| 6,169,400 B1 | * | 1/2001 | Sakuma ......................... 324/318 |
| 6,316,941 B1 | * | 11/2001 | Fujita et al. ................... 324/318 |
| 6,529,764 B1 | | 3/2003 | Kato et al. |
| 6,577,888 B1 | * | 6/2003 | Chan et al. .................... 600/422 |
| 6,591,128 B1 | * | 7/2003 | Wu et al. ........................ 600/422 |
| 6,806,711 B2 | * | 10/2004 | Reykowski ................... 324/318 |
| 6,943,551 B2 | | 9/2005 | Eberler et al. |
| 7,046,008 B2 | | 5/2006 | Okamoto et al. |
| 7,215,120 B2 | * | 5/2007 | Vaughan ....................... 324/318 |
| 7,345,483 B2 | * | 3/2008 | Vaughan ....................... 324/318 |
| 7,375,527 B2 | * | 5/2008 | Vaughan, Jr. ................. 324/318 |

(Continued)

FOREIGN PATENT DOCUMENTS

| | | |
|---|---|---|
| CN | 1692879 | 11/2005 |
| CN | 101103916 | 1/2008 |

(Continued)

OTHER PUBLICATIONS

German Office Action dated Feb. 4, 2013 for corresponding German Patent Application No. DE 10 2010 033 322.0 with English translation.
German Office Action dated Jun. 9, 2011 for corresponding German Patent Application No. DE 10 2010 033 322.0 with English translation.

(Continued)

*Primary Examiner* — Dixomara Vargas
(74) *Attorney, Agent, or Firm* — Lempia Summerfield Katz LLC

(57) ABSTRACT

The present embodiments relate to a local coil for a magnetic resonance tomography system, the local coil including an antenna element that includes a releasable connection to form an opening.

22 Claims, 4 Drawing Sheets

(56) References Cited

U.S. PATENT DOCUMENTS

| | | | |
|---|---|---|---|
| 7,518,373 B2 * | 4/2009 | Fischer et al. | 324/322 |
| 7,642,779 B2 * | 1/2010 | Ishihara et al. | 324/318 |
| 7,646,199 B2 * | 1/2010 | Dannels et al. | 324/318 |
| 7,659,719 B2 * | 2/2010 | Vaughan et al. | 324/318 |
| 7,990,147 B2 | 8/2011 | Driemel et al. | |
| 8,249,688 B2 * | 8/2012 | Bollenbeck et al. | 600/421 |
| 8,487,620 B2 * | 7/2013 | Brown et al. | 324/318 |
| 8,694,072 B2 | 4/2014 | Krueger | |
| 2002/0198450 A1 | 12/2002 | Reykowski | |
| 2008/0015430 A1 | 1/2008 | Takamori | |

FOREIGN PATENT DOCUMENTS

| | | |
|---|---|---|
| CN | 101609133 | 12/2009 |
| DE | 103 14 215 B4 | 11/2006 |
| DE | 10 2006 050 104 A1 | 5/2008 |
| WO | WO2010076684 | 7/2010 |

OTHER PUBLICATIONS

Chinese Office Action cited in 2011102219772, mailed Jun. 24, 2014.

German Office Action for German Application No. 10 2010 033 322.0, mailed Mar. 9, 2015, with English Translation.

* cited by examiner

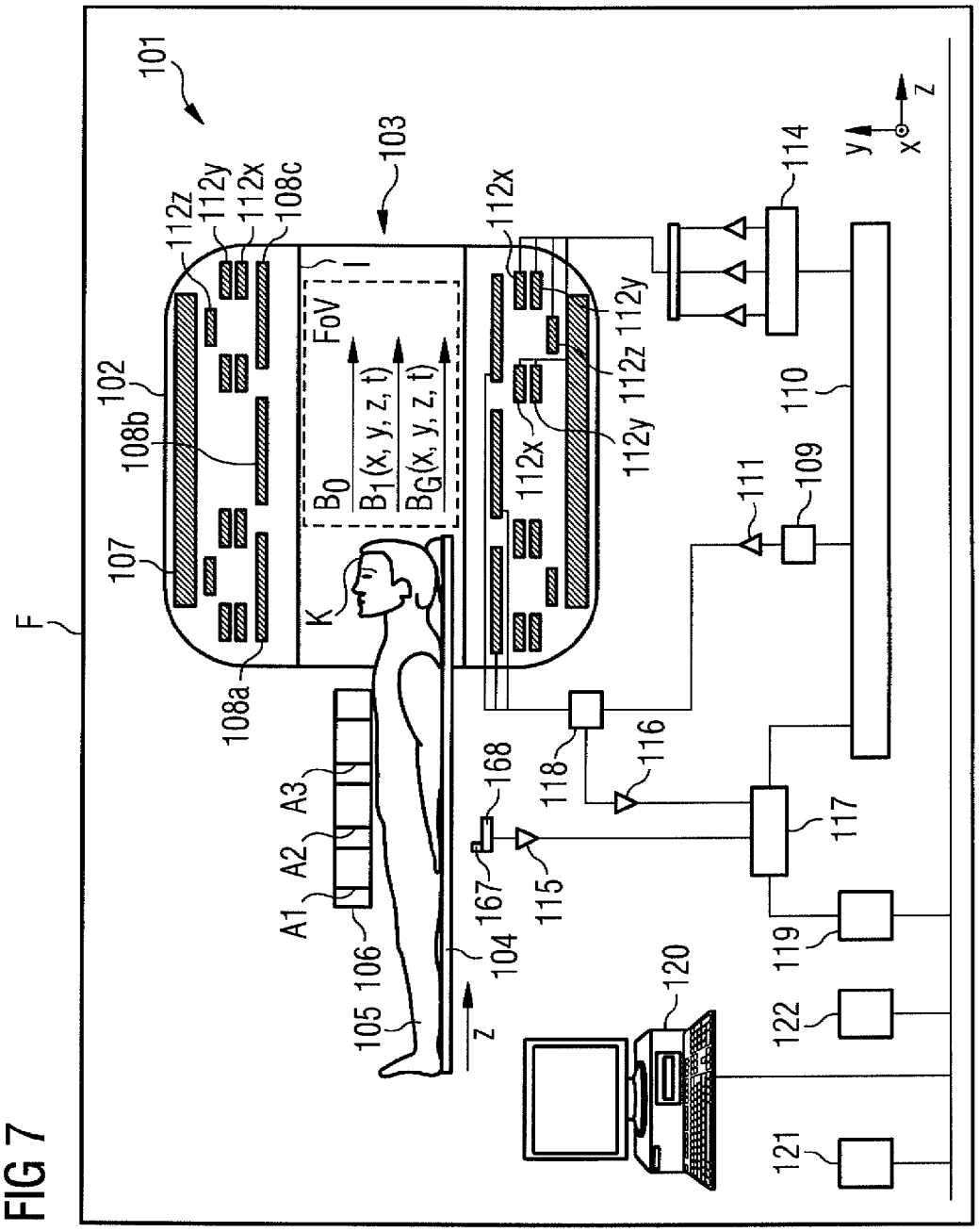

MECHANICALLY FLEXIBLE MAGNETIC RESONANCE COIL WITH OPENING CONDUCTOR STRUCTURES

This application claims the benefit of DE 10 2010 033 322.0, filed on Aug. 4, 2010.

BACKGROUND

The present embodiments relate to a magnetic resonance tomography (MRT) local coil for an MRT system.

MRT devices for examining objects or patients using magnetic resonance tomography (e.g., MRT, MRI) are known, for example, from DE10314215B4.

In MR tomography with a magnetic resonance tomography device (MR or MRT), images with a high signal to noise ratio (SNR) may be recorded using local coils. The local coils are antenna systems positioned in direct proximity on (anterior) or below (posterior) the patient. During an MR measurement, excited nuclei in the individual antennas of the local coil induce a voltage that is amplified using a low-noise preamplifier (e.g., LNA, preamp) and forwarded by cable to an electronic receive system. To improve the signal to noise ratio even with high-resolution images, high-field systems are used (e.g., 1.5 T to 12 T and more). Since more individual antennas may be connected to an MR receive system than there are receivers present, a switching matrix (e.g., RCCS) is incorporated between receive antennas and receivers. This routes the currently active receive channels (e.g., the receive channels present in the field of view (FoV) of the magnet at the time) to the receivers present. This allows more coil elements to be connected than there are receivers present, since for whole body coverage, only the coils present in the FoV or the homogeneity volume of the magnet are to be read out.

A "coil" or a "local coil" may be, for example, an antenna system that may include one or a plurality (e.g., in the case of an array coil) of antenna elements (or "coil elements"). These individual antenna elements may be configured as loop antennas (loops), butterfly coils or saddle coils. A coil includes, for example, the coil elements, a preamplifier, further electronics (e.g., baluns) and cabling, a housing and may include a cable with a plug (e.g., used to connect the coil to the MRT system). A receiver (RX) on the system side filters and digitizes a signal received from the local coil and transmits the digitized signal to a digital signal processor that may derive an image or a spectrum from the measurement. The digital signal processor may make the image or the spectrum available to the user for diagnosis purposes.

In interventional radiology, for example, it is possible or advantageous to perform imaging (e.g., MR imaging) using local coils and the intervention at the same time or almost at the same time, or at least to leave intervention instruments (e.g., needles, catheters, ablation instruments, biopsy needles) and coils set up in positions during the individual work steps. The coils may cover access to the patient to some extent. With coils that permit mechanical openings between the antenna structures, imaging and intervention may take place through the opening, and an antenna that encloses (e.g., surrounds) the site of the intervention is even advantageous for image quality.

According to the prior art, for example, two coils are each disposed to the side of the access point so that the two coils may also be removed laterally (e.g., by pushing to the side and/or in the x direction) when an instrument (e.g., person, animal) that extends out of the examination object in a direction orthogonal to the plane of a coil (and/or the y direction) is present in the examination object.

SUMMARY

The present embodiments may obviate one or more of the drawbacks or limitations in the related art. For example, magnetic resonance tomography local coils for an MRT system may be optimized.

The present embodiments optimize local coils (e.g., not only local coils for interventional radiology and/or imaging between interventions).

BRIEF DESCRIPTION OF THE DRAWINGS

FIG. 7 shows a schematic and simplified diagram of an MRT system.

DETAILED DESCRIPTION OF THE DRAWINGS

Figure 1:
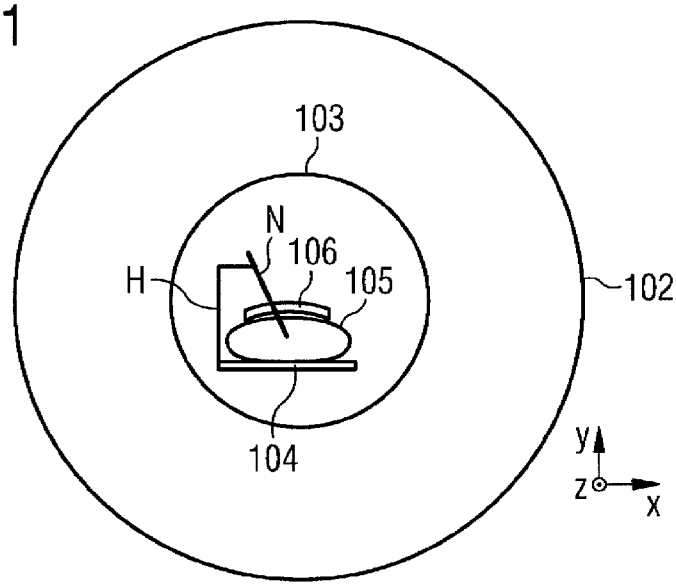
FIG. 1 shows a schematic diagram of one embodiment of a magnetic resonance tomography (MRT) local coil on a patient in an MRT system.

FIG. 7 shows an imaging magnetic resonance device MRT 101 (e.g., in a shielded room or Faraday cage F) with a whole body coil 102 with, for example, a tubular space 103, into which a patient couch 104 (e.g., a patient bed) holding a body 105 (e.g., of an examination object such as a patient; with or without a local coil arrangement 106) may be moved in the direction of arrow z in order to generate recordings of the patient 105 using an imaging procedure. Positioned on the patient, for example, is a local coil arrangement 106 that may be used to generate recordings in a local region (e.g., a field of view). Signals from the local coil arrangement 106 may be evaluated by an evaluation facility (e.g., elements 115, 117, 119, 120, 121) of the magnetic resonance device MRT 101 that may be connected, for example, by way of coaxial cable or by radio (e.g., elements 167, 168) to the local coil arrangement 106 (e.g., being converted to images, stored or displayed).

In order to use the magnetic resonance device MRT 101 to examine the body 105 (e.g., the examination object or the patient) using magnetic resonance imaging, different magnetic fields, the temporal and spatial characteristics of which are matched as closely as possible, are radiated onto the body 105. A powerful magnet (e.g., a cryomagnet 107) in a measuring cabin with, for example, the tunnel-type opening 103 generates a static powerful main magnetic field $B_0$, of, for example, 0.2 Tesla to 3 Tesla or even more. The body 105 to be examined is supported on the patient couch 104 and moved into a roughly homogeneous region of the main magnetic field B0 in the field of view FoV. The nuclear spin of atomic nuclei of the body 105 is excited by way of magnetic high-frequency excitation pulses $B1(x, y, z, t)$ that are radiated in via a high-frequency antenna (and/or optionally, a local coil arrangement) illustrated in FIG. 7 in a highly simplified manner as a body coil 108 (e.g., a high-frequency antenna; a multipart body coil 108a, 108b, 108c). High-frequency excitation pulses are generated, for example, by a pulse generating unit 109 that is controlled by a pulse sequence control unit 110. After amplification by a high-frequency amplifier 111, the high-frequency excitation pulses are routed to the high-frequency antenna 108. The high-frequency system shown in FIG. 7 is only indicated schematically. More than one pulse generating unit 109, more than one high-frequency amplifier 111 and a plurality of high-frequency antennas 108 a, b, c may be used in a magnetic resonance device 101. The magnetic resonance device 101 also includes gradient coils 112x, 112y, 112z that are used during a measurement to radiate in magnetic gradient fields for selective layer excitation and local encoding of the measurement signal. The gradient coils 112x, 112y, 112z are controlled by a gradient coil control unit 114 that, like the pulse generating unit 109, is connected to the pulse sequence control unit 110.

Signals emitted by the excited nuclear spins (of the atomic nuclei in the examination object) are received by the body coil 108 and/or at least one local coil arrangement 106, amplified by assigned high-frequency preamplifiers 116 and further processed and digitized by a receive unit 117. The recorded measurement data is digitized and stored as complex numerical values in a k-space matrix. A multidimensional Fourier transformation may be used to reconstruct an associated MR image from the value-populated k-space matrix.

With a coil that may be operated in both transmit and receive mode (e.g., the body coil 108 or a local coil), correct signal forwarding is regulated by an upstream transmit/receive switch 118.

An image processing unit 119 uses the measurement data to generate an image that is displayed to a user by way of an operating console 120 and/or is stored in a storage unit 121. A central computer unit 122 controls the individual system components.

In MR tomography, images with a high signal to noise ratio (SNR) may be recorded using local coil arrangements (e.g., coils, local coils). The local coil arrangements are antenna systems that are positioned in direct proximity on (anterior), below (posterior) or in the body. During an MR measurement, the excited nuclei induce a voltage in the individual antennas of the local coil, the induced voltage being amplified using a low-noise preamplifier (e.g., LNA, preamp) and being forwarded to an electronic receive system. To improve the signal to noise ratio even with high-resolution images, high-field systems are used (e.g., 1.5 T and more). If more individual antennas may be connected to an MR receive system than there are receivers present, a switching matrix (e.g., RCCS), for example, is incorporated between receive antennas and receivers. This routes the currently active receive channels (e.g., the receive channels present in the field of view of the magnet at the time) to the receivers present. This allows more coil elements to be connected than there are receivers present, since for whole body coverage, only the coils present in the FoV or the homogeneity volume of the magnet are to be read out.

The local coil arrangement 106 may be, for example, an antenna system that includes, for example, one or, in the case of an array coil, a plurality of antenna elements (e.g., coil elements). The individual antenna elements are configured, for example, as loop antennas (e.g., loops), butterfly coils or saddle coils. The local coil arrangement 106 includes, for example, coil elements, a preamplifier, further electronics (e.g., baluns), a housing, supports and may include a cable with plug used to connect the local coil arrangement 106 to the MRT system. A receiver 168 on the system side filters and digitizes a signal received from the local coil 106 (e.g., by radio) and transmits the digitized signal to a digital signal processing facility that may derive an image or spectrum from the data obtained by measurement. The digital signal processing facility may make the image or the spectrum available to the user (e.g., for the purposes of subsequent diagnosis and/or for storage).

Possible details of exemplary embodiments of magnetic resonance tomography (MRT) local coils are described in more detail below with reference to FIGS. 1-6.

FIG. 1 shows a cross-section through one embodiment of an MRT local coil 106 on a patient 105 in an MRT 101.

Figure 2:
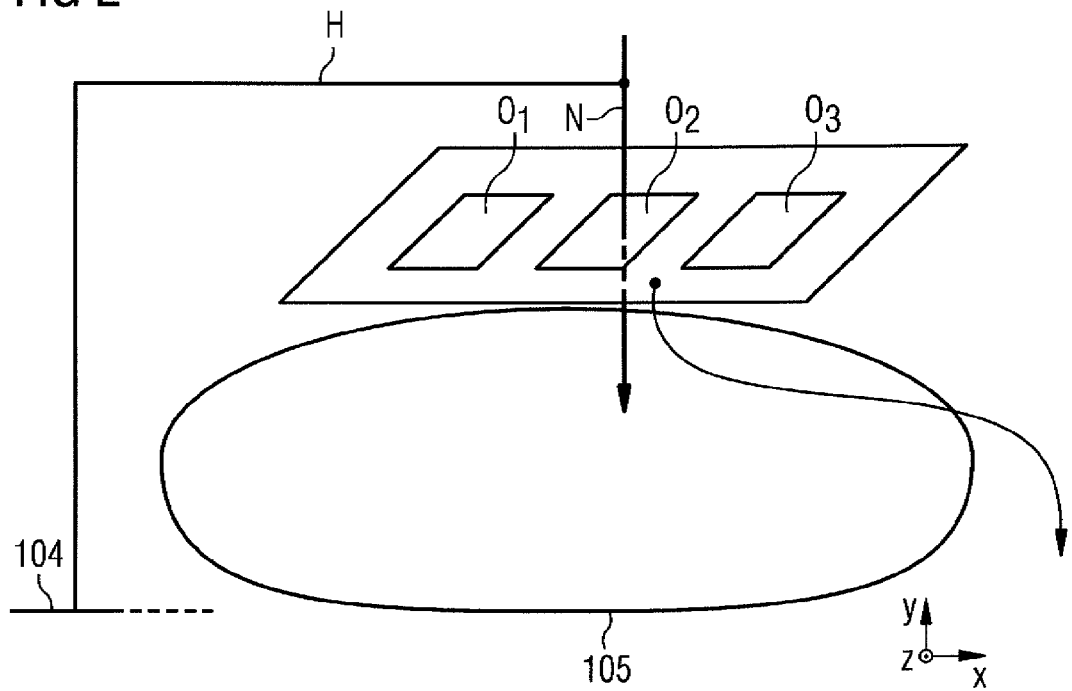
FIG. 2 shows a schematic diagram of an instrument in one embodiment of an MRT local coil on a patient.

FIG. 2 shows a schematic diagram of an interventional or surgical instrument N (e.g., a needle, a cannula, a clip, a retainer or a clamp) that extends through an antenna element A2 of one embodiment of an MRT local coil 106 (e.g., having an opening O2 in a closed state) and is present in a patient 105, the MRT local coil 106 (e.g., a breast coil, an abdomen coil, a leg coil, an arm coil, or a head coil) being located, for example, on or below the patient 105.

The interventional or surgical instrument N is supported by a holder H of suitable shape (e.g., C-shaped), for example, on a couch 104 or another system. The materials of the coil, the holder and the intervention instruments may be non-magnetic or minimally magnetic.

The local coil 106 includes one or more antenna elements A1, A2, A3 (e.g., circular or approximately square antenna elements) in a housing G that is, for example, flexible and/or made of foam. Each of the one or more antenna elements A1, A2, A3 includes an opening O1, O2, O3 (e.g., enclosed/surrounded on a periphery by the antenna element) in a conductor track plane (x-z) of the antenna element A1, A2, A3. At least one surgical element may be passed through each of the openings O1, O2, O3.

Figure 3:
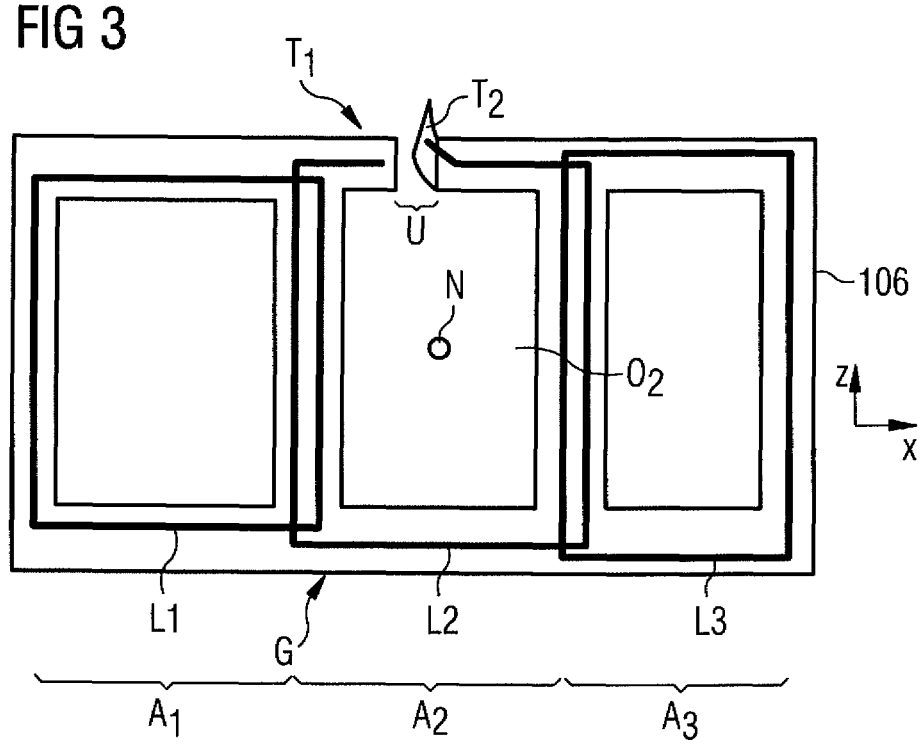
FIG. 3 shows a schematic diagram of one embodiment of an MRT local coil.

FIG. 3 shows a schematic diagram of one embodiment of the MRT local coil 106 with the opening O2 in the opened state (e.g., in the form of a lateral opening U). Two parts T1, T2 are held away from one another to form an opening U (e.g., a lateral opening) in the opened state so that an instrument N may be moved out of the local coil 106 (e.g., through opening O2 of the antenna element A2; moved laterally) in the x-z plane (e.g., without removing the local coil 106 from the patient).

Figure 4:
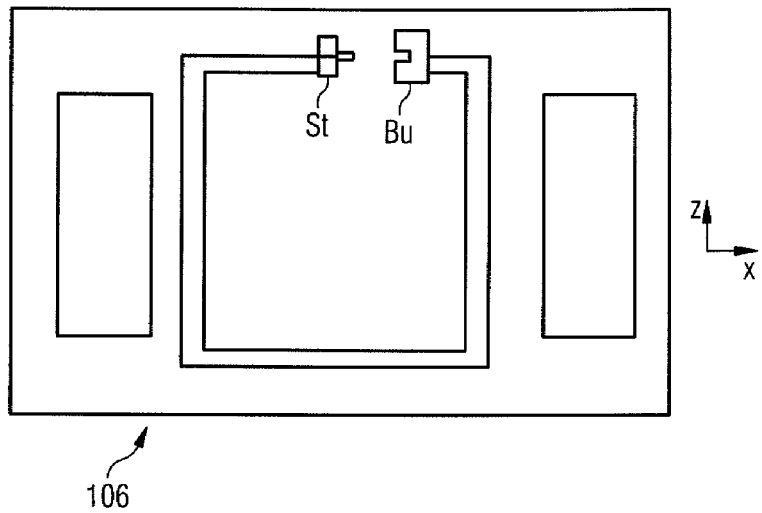
FIG. 4 shows a schematic diagram of one embodiment of an MRT local coil with an antenna having an opening option in the form of a galvanic contact.

FIG. 4 shows a schematic diagram of one embodiment of an MRT local coil 106 with an antenna A2 having an opening option U with a separable galvanic contact (St-Bu) between two subregions T1, T2 of the antenna A2. The opening option U includes a plug-type connection with a plug (e.g., St) and a socket (e.g., Bu), each in a subregion T1, T2 of the local coil 106 (e.g., the antenna element A2 of the).

Figure 5:
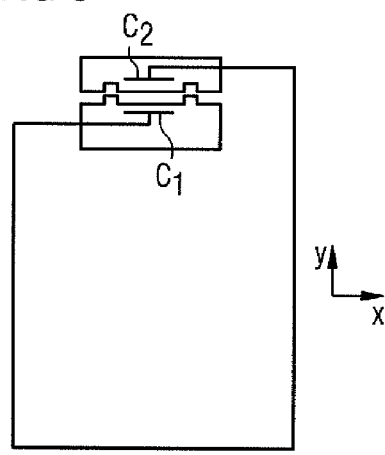
FIG. 5 shows a schematic diagram of one embodiment of an MRT local coil with an antenna having an opening option in the form of a capacitive contact.

FIG. 5 shows a schematic diagram of one embodiment of an MRT local coil 106 with an antenna A2 having an opening option U using a capacitive contact between two subregions T1, T2 of the antenna A2, a capacitive connection, in which a part C1-bottom and C2-top of a capacitive element C1 (e.g., a capacitor) is disposed respectively in one of the two releasable subregions T1, T2 of the antenna element A2, being provided.

Figure 6:
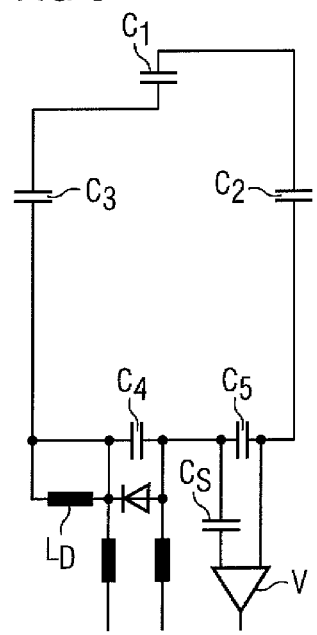
FIG. 6 shows a schematic diagram of a circuit for one embodiment of an MRT local coil with an opening option in the form of a capacitive contact according to FIG. 5.

FIG. 6 shows a schematic diagram of an exemplary embodiment of a circuit for one embodiment of an MRT local coil with an opening option in the form of a capacitive contact according to FIG. 5. The circuit may be connected via a preamplifier V to an evaluation facility of an MRT.

One embodiment according to FIG. 3 includes a mechanical and electrical opening capacity of conductor structures of at least one antenna element (e.g., with respect to a conductor loop and a housing of the at least one antenna element) of, for example, a mechanically flexible local coil. In the opened state of the antenna element, the opening allows access to the patient in at least one intermediate space (e.g., an opening) between the conductors. In one embodiment, connecting methods that are suitable for employment in a sterile environment may be used.

According to one embodiment, the local coil 106 is set up so that one or more antenna elements A2 (e.g., center antenna element according to FIG. 3) are set up so that conductor structures L2 of the one or more antenna elements are interrupted by a releasable connection (e.g., U and/or St-Bu and/or C1top-C1bottom and/or T1-T2). A connection point, for example, establishes a releasable electrical contact. This releasable electrical contact may be configured, for example, according to FIG. 4 as a galvanic coupling (e.g., metal on metal) or according to FIG. 5, as a capacitive or inductive coupling. The galvanic connection may be established mechanically as a pin, a coaxial plug, a pushbutton connection or a joint. The capacitive connection may be configured in the form of two faces that are moved into a defined position in relation to one another due to the mechanical structure. The mechanical structure is configured, for example, so that a form-fit connection between upper and lower pails becomes possible. The two faces may be pressed against one another by way of a screw, a clip, a lever mechanism, pins, buttons, hooks and other form-fit connections.

A non-galvanic structure has the advantage that the connection points are easy to clean, as the faces may also be part of the dielectric of the capacitor. With the capacitive coupling solution, the capacitance resulting at the contact point may also be configured as part of the capacitance of the series resonant circuit provided by the receive coil.

The opening contact U may be used at one point on the coil or at a plurality of points to open a plurality of antennas A1, A2, A3 of the local coil.

The entire local coil may be configured as a mechanically flexible coil to allow optimum molding to the geometry of the patient.

All the cited possible details of exemplary embodiments of the MRT local coils may be provided individually or in any combination.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil comprising:
    an antenna element that includes a releasable connection to form an opening,
    wherein the local coil is configured to be positioned in a conductor track plane in a body or on the body such that no portion of the local coil encircles the body all the way around the body when the releasable connection of the antenna element is closed,
    wherein the body is positioned in the conductor track plane or a plane parallel to the conductor track plane,
    wherein the opening of the antenna element is positioned in the conductor track plane such that an instrument is passable through the opening in a lateral direction along the conductor track plane without removing the local coil from the body or position on the body.

2. The local coil as claimed in claim 1, wherein the releasable connection is between two parts or subregions of a conductor loop of the antenna element to form the opening.

3. The local coil as claimed in claim 2, wherein the antenna element, in a state, in which the releasable connection between the two parts within the antenna element is unopened, includes a conductor loop closed in one plane.

4. The local coil as claimed in claim 1, comprising a plurality of antenna elements, the plurality of antenna elements comprising the antenna element,
    wherein the releasable connection is provided in a center antenna element of the plurality between two subzones of the center antenna element, the center antenna element being between two antenna elements of the plurality.

5. The local coil as claimed in claim 3, wherein the conductor loop is a galvanically or capacitively transmitting conductor loop.

6. The local coil as claimed in claim 1, wherein the releasable connection is within a conductor loop, a power circuit of the antenna element, or the conductor loop and the power circuit of the antenna element.

7. The local coil as claimed in claim 6, wherein, when the releasable connection is released, the opening is formed between two parts of the antenna element held away from one another by the release of the releasable connection.

8. The local coil as claimed claim 1, wherein, when the releasable connection is released, the opening is formed between two subregions of the antenna element held away from one another by the release of the releasable connection.

9. The local coil as claimed in claim 1, wherein, when the releasable connection is released, the opening is formed between two parts of the antenna element held away from one another by the release of the releasable connection.

10. The local coil as claimed in claim 1, wherein the local coil comprises an elastic housing, the antenna element comprises a conductor loop, or the local coil comprises the elastic housing and the antenna element comprises the conductor loop, and
    wherein the elastic housing, the conductor loop, or the elastic housing and the conductor loop are operable to hold away parts of the antenna element from one another to form the opening.

11. The local coil as claimed in claim 10, wherein the elastic housing comprises flexible plastic, foam or a joint, with which one of the parts is fastened to the remainder of the elastic housing.

12. The local coil as claimed in claim 1, wherein the releasable connection comprises a galvanic connection between two subregions of a conductor loop of the antenna element.

13. The local coil as claimed in claim 1, wherein the releasable connection comprises a mechanically releasable connection within a power circuit of the antenna element.

14. The local coil as claimed in claim 1, wherein the releasable connection comprises a plug-type connection between two releasable parts of the antenna element, and
    wherein a housing of the local coil is operable to hold the two releasable parts away from one another.

15. The local coil as claimed in claim 1, wherein the releasable connection comprises a capacitive connection between two releasable parts of the antenna element, and
    wherein a part of a capacitive element of the capacitive connection is disposed in one of the two releasable parts of the antenna element.

16. The local coil as claimed in claim 1, comprising a plurality of antenna elements, the plurality of antenna elements comprising the antenna element.

17. The local coil as claimed in claim 1, wherein the releasable connection is provided at only one point in only the antenna element.

18. The local coil as claimed in claim 1, wherein the releasable connection is provided at a plurality of points in only the antenna element or in a plurality of antenna elements, the plurality of antenna elements comprising the antenna element.

19. The local coil as claimed in claim 1, wherein the local coil, the antenna element, or the local coil and the antenna element are mechanically flexible.

20. The local coil as claimed claim 2, wherein, when the releasable connection is released, the opening is formed between two subregions of the antenna element held away from one another by the release of the releasable connection.

21. The local coil as claimed in claim 1,
wherein the local coil is a loop antenna, a butterfly coil, or a saddle coil.

22. A local coil for a magnetic resonance tomography system, the local coil comprising:
an antenna element that includes a releasable connection to form an opening,
wherein the local coil is configured to be positioned in a conductor track plane in a body or on the body such that no portion of the local coil encircles the body all the way around the body when the releasable connection of the antenna element is closed,
wherein the body is positioned in the conductor track plane or a plane parallel to the conductor track plane,
wherein the releasable connection is between two parts or subregions of a conductor loop of the antenna element to form the opening when the releasable connection is released,
wherein the antenna element, in a state, in which the releasable connection between the two parts within the antenna element is closed, includes a conductor loop closed in a plane, and
wherein when the releasable connection is released, the opening is formed between two parts of the antenna element held away from one another by the release of the releasable connection, and an instrument is passable through the opening in a lateral direction along the conductor track plane without removing the local coil from the body or position on the body.

* * * * *